US012749536B2

(12) United States Patent
Kim et al.

(10) Patent No.: US 12,749,536 B2
(45) Date of Patent: Sep. 29, 2026

(54) MEMORY DEVICE PERFORMING IN-MEMORY COMPUTING

(71) Applicant: SEOUL NATIONAL UNIVERSITY R&DB FOUNDATION, Seoul (KR)

(72) Inventors: Jae-Joon Kim, Seoul (KR); Inhwan Lee, Seoul (KR); Eunhwan Kim, Pohang-si (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 100 days.

(21) Appl. No.: 18/985,791

(22) Filed: Dec. 18, 2024

(65) Prior Publication Data

US 2025/0316314 A1 Oct. 9, 2025

(30) Foreign Application Priority Data

Dec. 26, 2023 (KR) ........................ 10-2023-0191496
Apr. 19, 2024 (KR) ........................ 10-2024-0052528

(51) Int. Cl.
*G11C 11/54* (2006.01)
*G11C 16/04* (2006.01)
*G11C 16/10* (2006.01)
*G11C 16/26* (2006.01)

(52) U.S. Cl.
CPC .......... *G11C 16/10* (2013.01); *G11C 16/0483* (2013.01); *G11C 16/26* (2013.01)

(58) Field of Classification Search
CPC .......................................... G11C 11/401–4099
See application file for complete search history.

(56) References Cited

U.S. PATENT DOCUMENTS 11,011,216 B1 5/2021 Srivastava
2023/0196079 A1 6/2023 Zhang et al.

FOREIGN PATENT DOCUMENTS

KR 10-2023-0078218 A 6/2023
KR 10-2023-0164863 A 12/2023

OTHER PUBLICATIONS

Inhwan Lee et al., "In-Memory Neural Network Accelerator based on eDRAM Cell with Enhanced Retention Time", 2023 60th ACM/IEEE Design Automation Conference (DAC), Jul. 9, 2023.

*Primary Examiner* — Alfredo Bermudez Lozada
(74) *Attorney, Agent, or Firm* — Bridgeway IP Law Group, PLLC; Jihun Kim

(57) ABSTRACT

A memory device includes a plurality of memory cells configured to perform in-memory computing. Each of the plurality of memory cells includes a first switching element that is switched by a write word line and has one terminal connected to a write bit line and another as a data storage node; a second switching element and a third switching element that are switched according to a voltage of the data storage node, are serially connected between a power supply voltage and a read word line, and commonly have a serially connected node used as an operation node; a fourth switching element that is switched by support word line and has one terminal connected to a read bit line and another terminal connected to the operation node; and an operation capacitor connected between the operation node and an operation bit line.

14 Claims, 15 Drawing Sheets

| | writing | reading | holding |
|---|---|---|---|
| WWL | 0 | 1 | 1 |
| WBL | 0 or 1 | 0 | 0 |
| RWL | 1 | 0 | 1 |
| SWL | 1 | 0 | 1 |
| RBL | 1 | 0≥0 or 1 | 1 |

FIG. 5

| Weight \ Input | 0 (RWL = 1, SWL = 0) | 1 (RWL = 0, SWL = 1) |
|---|---|---|
| 0 (Storage node = 0) | — | — |
| 1 (Storage node = 1) | — | Pull down (ΔV) |

* $V_{CBL}$ state

| | writing | reading | holding |
|---|---|---|---|
| WWL | 0 | 1 | 1 |
| WBL | 0 or 1 | 0 | 0 |
| RWL | 0 | 1 | 0 |
| SWL | 0 | 1 | 0 |
| RBL | 0 | 0≥0 or 1 | 0 |

FIG. 11

| Weight \ Input | 0 (RWL = 1, SWL = 0) | 1 (RWL = 0, SWL = 1) |
|---|---|---|
| 0 (Storage node = 0) | Pull up ($\Delta V$) | — |
| 1 (Storage node = 1) | — | — |

* $V_{CBL}$ state

MEMORY DEVICE PERFORMING IN-MEMORY COMPUTING

CROSS-REFERENCE TO RELATED APPLICATION

This application claims the benefit under 35 USC 119 (a) of Korean Patent Application Nos. 10-2024-0052528 filed on Apr. 19, 2024 and 10-2023-0191496 filed on Dec. 26, 2023 in the Korean Intellectual Property Office, the entire disclosures of which are incorporated herein by reference for all purposes.

BACKGROUND

1. Field

The present disclosure relates to a memory device that performs in-memory computing.

2. Description of the Related Art

In order to solve a memory bottleneck problem that occurs when performing operations by using the known Von Neumann computer structure, research on computing in memory (CIM) that may perform operations in the memory cell is actively being conducted. The CIM is also called in-memory computing (IMC) or processing in memory (PIM), and is technology for enabling a memory device to perform computational functions in addition to data storage functions, and has been widely studied recently as a technology for implementing artificial intelligence (AI) semiconductors.

The conventional static random access memory (SRAM)-based CIM technology, which is compatible with the conventional CMOS process, additionally includes transistors and metal wires for operational functions, and accordingly, a memory cell size increases, resulting in a problem in that the entire memory capacity decreases. Therefore, there is an increasing demand for research on embedded dynamic RAM (eDRAM) which is CIM and has operation capability and may increase memory capacity with a small number of transistors.

The conventional technology related thereto includes current source-based eDRAM, charge sharing-based eDRAM utilizing junction capacitors, eDRAM CIM cells, each being based on capacitive coupling and including general 1-transistor and 1-capacitor (1T1C), and so on.

FIGS. 1A to 1C illustrates general eDRAM-based CIM cells.

First, FIGS. 1A and 1B illustrate current source-based eDRAMs that respectively have a 2T1C structure and a 3T1C structure.

Memory cells illustrated in FIGS. 1A and 1B may each have a structure in which stored cell data directly affects an output node, and when cell data changes over time due to a leakage current, a voltage of the output node also changes over time. In addition, a current source structure composed of transistors has a structure that is vulnerable to changes in process, voltage, and temperature (PVT), and accordingly, the current source structure may not have a stable output value. Also, the intensity of the current source changes according to a voltage of an output node, and accordingly, an output value may not be accumulated linearly.

In addition, a memory cell illustrated in FIG. 1C is an eDRAM cell using a junction capacitor-based charge sharing method and has a characteristic that changes capacity of a junction capacitor according to PVT changes, and accordingly, a stable output value may not be provided, and an output value may not be accumulated linearly.

In this way, in order to solve a disadvantage of data retention time of the conventional memory cells and a problem of vulnerability of a transistor to PVT changes, the present disclosure proposes a memory cell of a new structure that may simulate an operation of a digital logic gate.

The prior patent document related thereto includes Korean Patent Publication No. 10-2023-0078218 (Title of invention: Memory device having local computing cell based on computing-in-memory).

SUMMARY

The present disclosure provides a memory device including memory cells that perform in-memory computing operations through imitation.

However, technical objects to be achieved by the present embodiment are not limited to the technical objects described above, and there may be other technical objects.

According to an aspect of the present disclosure, a memory device includes a plurality of memory cells configured to perform in-memory computing, wherein each of the plurality of memory cells includes a first switching element that is switched in response to a signal applied to a write word line and has one terminal connected to a write bit line and another terminal used as a data storage node; a second switching element and a third switching element that are switched according to a voltage of the data storage node, are serially connected between a power supply voltage and a read word line, and commonly have a serially connected node used as an operation node; a fourth switching element that is switched in response to a signal applied to a support word line and has one terminal connected to a read bit line and another terminal connected to the operation node; and an operation capacitor connected between the operation node and an operation bit line, and the second switching element and the third switching element have opposite polarities.

A memory device includes a plurality of memory cells configured to perform in-memory computing, wherein each of the plurality of memory cells includes: a first switching element that is switched in response to a signal applied to a write word line and has one terminal connected to a write bit line and another terminal used as a data storage node; a second switching element and a third switching element that are switched according to a voltage of the data storage node, are serially connected between a read word line and a ground voltage, and commonly have a serially connected node used as an operation node; a fourth switching element that is switched in response to a signal applied to a support word line and has one terminal connected to a read bit line and another terminal connected to the operation node; and an operation capacitor connected between the operation node and an operation bit line, and the second switching element and the third switching element have opposite polarities.

According to the present disclosure, the energy and area efficiency of a memory cell performing a computing-in-memory operation may be increased by utilizing a capacitive coupling effect. Also, unlike the conventional technology, the present disclosure provides a digital logic gate operation by utilizing a plurality of switching elements, and thus, the present disclosure provides a characteristic that is robust to PVT changes. That is, even when a value of a storage node changes over time due to a leakage current or a characteristic of a transistor changes due to PVT changes, a stable output value may be provided unlike the conventional technologies. Also, the present disclosure uses a gain-cell structure, and thus, a write port is separated from a read port, which may solve a problem of data being destroyed during execution of a memory read command.

BRIEF DESCRIPTION OF THE DRAWINGS

FIGS. 4, 5, 6, 7A, 7B, 7C, 7D, and 8 are diagrams illustrating operations of a NAND type memory cell according to an embodiment of the present disclosure.

FIGS. 10, 11, 12, 13A, 13B, 13C, 13D, and 14 are diagrams illustrating operations of a NOR type memory cell according to an embodiment of the present disclosure.

DETAILED DESCRIPTION

Figure 1A:
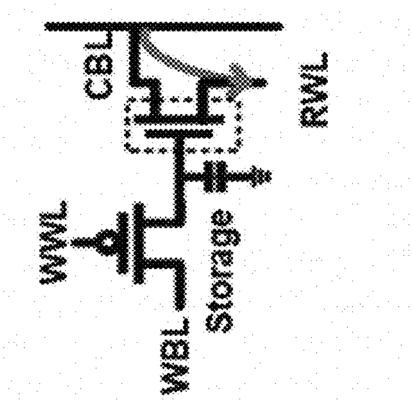
FIGS. 1A, 1B and 1C illustrate a general eDRAM-based computing in memory cell.
Figure 1B:
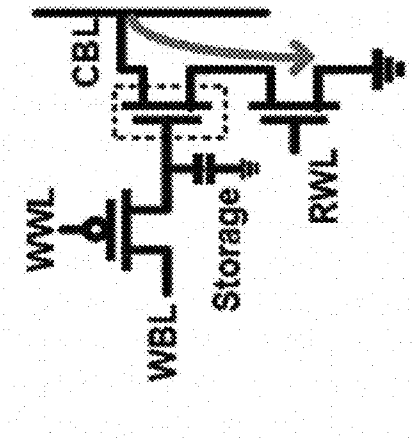
Figure 1C:
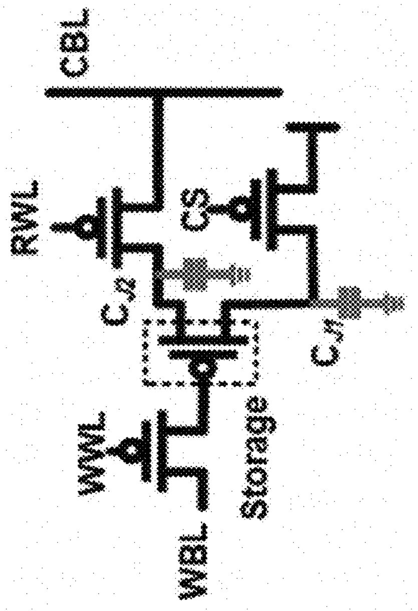

Hereinafter, embodiments of the present disclosure will be described in detail with reference to the attached drawings such that those skilled in the art to which the present disclosure belongs may easily practice the present disclosure. However, the present disclosure may be implemented in various different forms and is not limited to the embodiments described herein. In addition, in order to clearly describe the present disclosure in the drawings, parts that are not related to the description are omitted, and similar components are given similar reference numerals throughout the specification.

In the entire specification of the present disclosure, when a component is described to be "connected" to another component, this includes not only a case where the component is "directly connected" to another component but also a case where the component is "electrically connected" to another component with another element therebetween. In addition, when it is described that a portion "includes" a certain component, this means that the portion may further include another component without excluding another component unless otherwise stated.

In the present disclosure, a "portion" includes a unit realized by hardware, a unit realized by software, and a unit realized by using both. In addition, one unit may be realized by using two or more pieces of hardware, and two or more units may be realized by using one piece of hardware. Meanwhile, a "~ portion" is not limited to software or hardware, and a "~ portion" may be configured to be included in an addressable storage medium or may be configured to reproduce one or more processors. Therefore, in one example, "~ portion" refers to components, such as software components, object-oriented software components, class components, and task components, and includes processes, functions, properties, and procedures, subroutines, segments of program code, drivers, firmware, microcode, circuits, data, databases, data structures, tables, arrays, and variables. The functions provided within the components and "portions" may be combined into a smaller number of components and "portions" or may be further separated into additional components and "portions". Additionally, components and "portions" may be implemented to regenerate one or more central processing units (CPUs) included in a device or security multimedia card.

Figure 2:
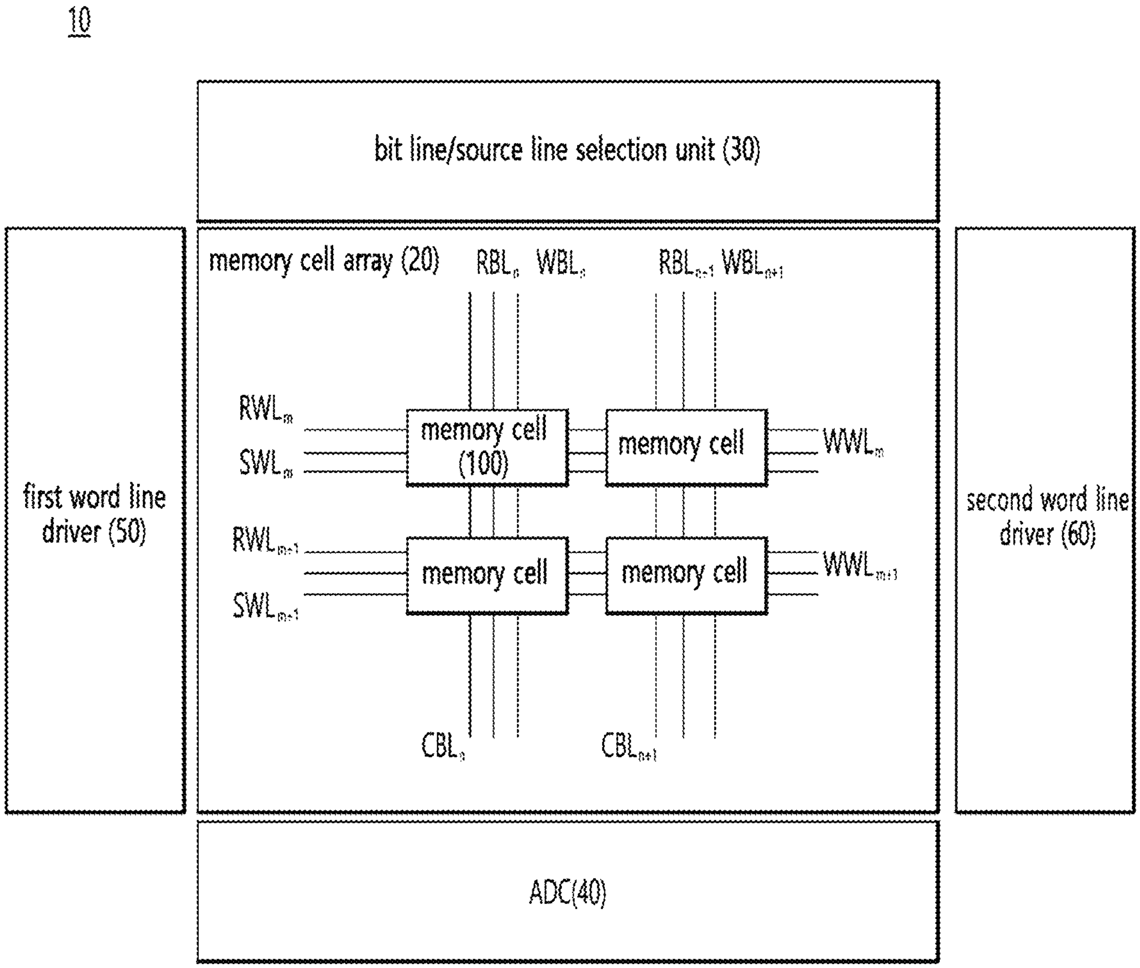
FIG. 2 illustrates a memory device according to an embodiment of the present disclosure.

FIG. 2 illustrates a memory device according to an embodiment of the present disclosure.

A memory device 10 includes a memory cell array 20 including one or more memory cells 100 arranged in an array form and various peripheral circuits. The peripheral circuits may include a bit line/source line selection unit and sense amplifier 30 that switch bit lines or source lines connected to each memory cell, an analog-to-digital converter (ADC) 40 that converts analog output of the memory cell array 20 into digital data, a first word line driver 50, and a second word line driver 60. The first word line driver 50 may drive a read word line RWL and a support word line SWL, and the second word line driver 60 may drive a write word line WWL.

The memory cells 100 included in the memory cell array 20 perform in-memory computing and are connected to the write bit line WBL, the read bit line RBL, an operation bit line CBL, a read word line RWL, a write word line WWL, and a support word line SWL. In addition, an output value of each of the memory cells 100 is transmitted to the ADC 40 through the operation bit line CBL.

Figure 3:
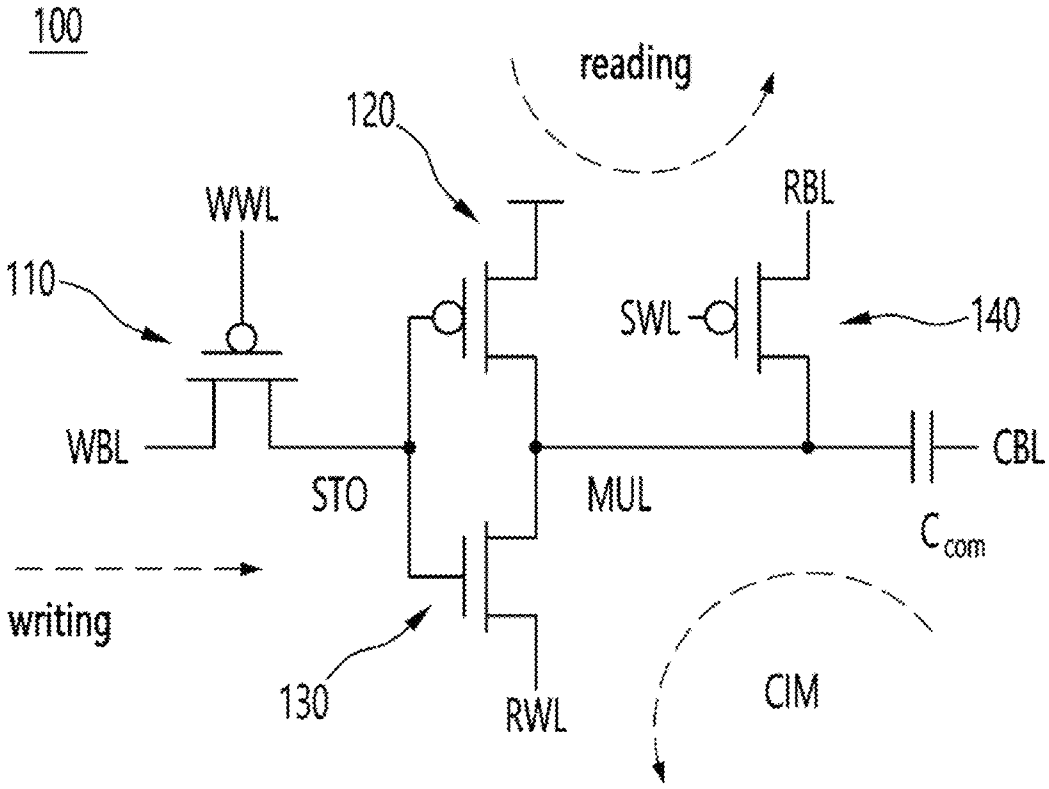
FIG. 3 is a diagram illustrating a configuration of a NAND type memory cell included in the memory device according to the present disclosure.

FIG. 3 is a diagram illustrating a configuration of the memory cell 100 of a NAND type included in the memory device 10 of the present disclosure.

The memory cell 100 includes a first switching element 110 having a gate connected to the write word line WWL, one terminal connected to the write bit line WBL, and the other terminal used as a data storage node STO; a second switching element 120 and a third switching element 130 which are switched according to the data storage node STO, connected in series between a power supply voltage and the read word line RWL, and commonly have a serially connected node connected between the second switching element 120 and the third switching element 130 and used as an operation node MUL; a fourth switching element 140 having a gate connected to the support word line SWL, one terminal connected to the read bit line RBL, and the other terminal connected to the operation node MUL; and an operation capacitor Ccom connected between the operation node MUL and the operation bit line CBL.

In this case, the second switching element 120 and the third switching element 130 are configured as switching elements having opposite polarities, and accordingly, only one of the second switching element 120 and the third switching element 130 is turned on according to a value of the data storage node STO. In addition, the first switching element 110, the second switching element 120, and the fourth switching element 140 may be PMOS transistors, and the third switching element 130 may be an NMOS transistor but are not limited thereto and may be modified into other types of switching elements.

In this way, the memory cell 100 of the present disclosure is configured to include four transistors and one capacitor. In order to accumulate a voltage value through the operation bit line CBL, a capacitive coupling effect is utilized through the operation capacitor Ccom. Also, in order not to affect a size of the memory cell 100, a final operation capacitor may be implemented by a metal-oxide-metal capacitor (MOMCAP) that is formed by stacking metal lines on a memory cell implemented by a transistor.

Unlike 1T1C dynamic random access memory (DRAM) which is the known conventional technology, the present disclosure uses a gain-cell structure, and accordingly, a write port and a read port are separated from each other, and a problem of data being destroyed during execution of a memory read command may be solved. In addition, the conventional gain-cell structure has a problem in that data retention time is short because data is stored by using only one transistor. To solve the problem, the present disclosure stores data through two transistors connected in series, and accordingly, the capacitance of a gate storing data is doubled, and thereby, data retention time may be increased.

In addition, when operating is performed within the memory cell 100, the data of the data storage node STO is not used as it is for operation, but capacitive coupling is made to the operation bit line CBL through a compensated value of the operation node MUL by the second switching element 120 and the third switching element 130, and accordingly, a stable computing-in-memory operation may be performed.

FIGS. 4, 5, 6, 7A, 7B, 7C, 7D, and 8 are diagrams illustrating operations of a memory cell of a NAND type according to an embodiment of the present disclosure.

Figure 4:
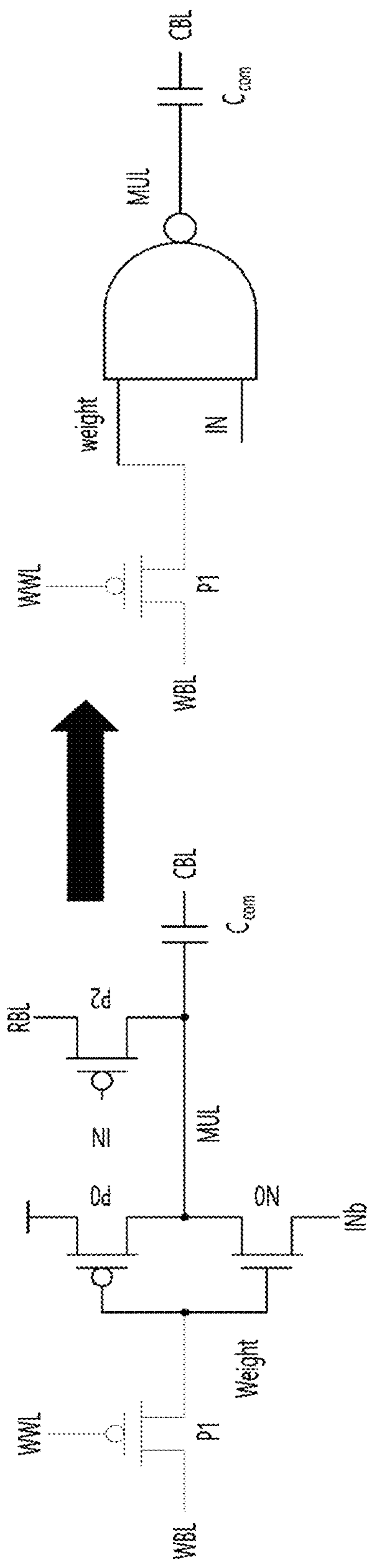

As illustrated in FIG. 4, the memory cell 100 operates like a digital logic gate that performs a NAND operation, and has a technical characteristic in that a voltage of a final output terminal is accumulated by using a capacitive coupling effect. The characteristic of the digital logic gate is a robust characteristic against external noise and PVT changes. Even when input values of the digital logic gate change due to external factors, an output value of the digital logic gate is reliably generated as a value of "0" or "1".

The data stored in the data storage node STO of the memory cell 100 may change over time due to a leakage current. When data of "1" is stored in the data storage node STO, the stored data changes to "O" data due to a pull-down leakage current through the first switching element 110 and the third switching element 130. Also, when data of "0" is stored in the data storage node STO, the stored data changes to "1" due to a pull-up leakage current through the second switching element 120. That is, the data stored in the memory cell 100 has characteristic that changes a value over time. Because the conventional technologies use memory cell data that changes over time directly for a computing-in-memory operation, there is a problem in that an output value is not output stably over time and changes. However, because the memory cell 100 of the present disclosure operates as a digital logic gate, and accordingly, even when the data value stored in the data storage node STO of the memory cell 100 changes over time, a value of "O" or "1" is stably output from the operation node MUL which is an output node, and accordingly, a stable operation may be performed over time. Also, due to this, data retention time may be increased, unlike the conventional memory cells.

In addition, because the conventional technology operates on a charge sharing method through a current source of a single transistor and a junction capacitor, the memory cell is vulnerable to PVT changes and does not have a stable output value. However, because the present disclosure operates as a digital logic gate, the memory cell has a characteristic that is robust to PVT changes and has a stable output value. Also, when a MOMCAP is used as the operation capacitor Ccom used to form a final voltage value, it is possible to have an output value that is stable and robust to PVT changes.

A main operation of the memory cell 100 is described below with reference to FIG. 5.

The memory cell 100 performs operations on storage data and input data while performing basic operations as a memory, such as writing, reading, and holding.

First, during a write operation mode of the memory cell 100, in a state where the first switching element 110 is turned on according to a signal provided to the write word line WWL, and the fourth switching element 140 is turned off according to a signal provided to the support word line SWL, and write data (0 or 1) is transmitted to the data storage node STO through the write bit line WBL. Also, in order to write data of "0" to the data storage node STO without loss equivalent to a threshold voltage Vth, a voltage lower than a ground voltage VSS may be provided to the write word line WWL.

In addition, during a hold operation mode of the memory cell 100, in a state where the first switching element 110 is turned off according to the signal provided to the write word line WWL and the fourth switching element 140 is turned off according to the signal provided to the support word line SWL, the power supply voltage VDD is applied to the read word line RWL and the read bit line RBL, and the ground voltage VSS is applied to the write bit line WBL, and accordingly, a state of the data storage node STO is holded.

In addition, a read operation mode of the memory cell 100 is described below. Before performing the read operation, the read bit line RBL is pre-discharged, and in this case, the power supply voltage VDD is applied to the read word line RWL, the support word line SWL, and the operation bit line CBL. Thereafter, the read word line RWL is grounded, and the fourth switching element 140 is turned on according to the signal provided to the support word line SWL, and accordingly, the data stored in the data storage node STO is output to the read bit line RBL through the fourth switching element 140. When "O" is stored in the data storage node STO, the second switching element 120 is turned on, and accordingly, the power supply voltage is output to the read bit line RBL, and when "1" is stored in the data storage node STO, the third switching element 130 is turned on, and accordingly, the ground voltage is output to the read bit line RBL. Accordingly, the data stored in the data storage node STO may be clearly distinguished as "0" and "1".

Next, an operation of the memory cell 100 is described below.

The memory cell 100 performs an operation on the storage data and the input data, the storage data is stored in the data storage node STO, and the external input data is input to the support word line SWL. In this case, the storage data may be weight data that constitutes an artificial intelligence model or a deep neural network model for which learning is completed, and the input data may be activation data transmitted from a previous layer of a deep neural network.

Figure 6:
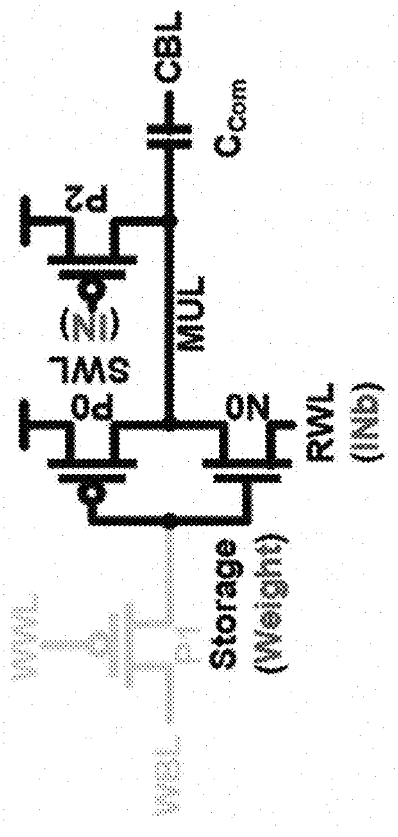

As illustrated in FIG. 6, a value stored in the data storage node STO is used as weight data, a value input through the support word line SWL is used as input data, and a NAND operation result of the weight data and the input data is output to the data operation node MUL. In addition, in order to deactivate a memory write operation, the power supply voltage VDD is applied to the write word line WWL to turn off the first switching element 110, and the ground voltage VSS is applied to the write bit line WBL.

Figure 7A:
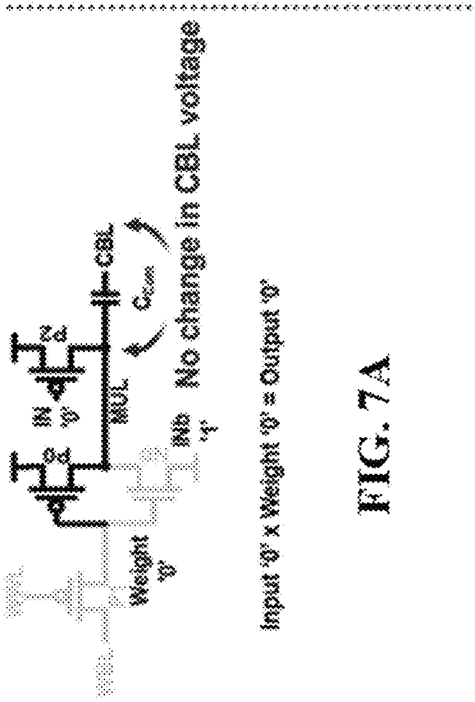
Figure 7B:
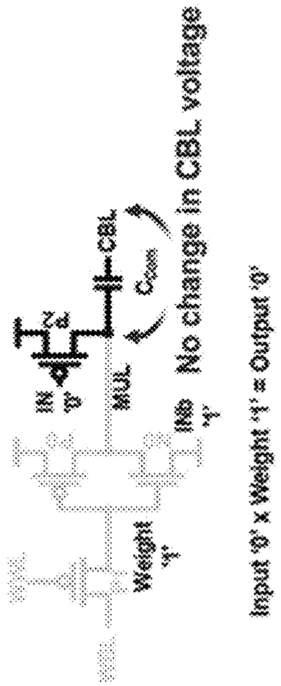

During an operation of the memory cell 100, in a state where the power supply voltage VDD is applied to the read bit line RBL, and in a state where the data operation node MUL and the operation bit line CBL are pre-charged, when the input data is 0, the fourth switching element 140 is turned on to pull up the operation node MUL, and accordingly, the data operation node MUL is holded in a pre-charged state at a high level regardless of the storage data, and the operation bit line CBL also holds a charged state. That is, an operation result "0" that does not cause any operation is output. This operation is illustrated in FIGS. 7A and 7B.

In addition, when the input data is "1", the fourth switching element 140 is turned off, and an output of the operation bit line CBL changes according to the storage data.

Figure 7C:
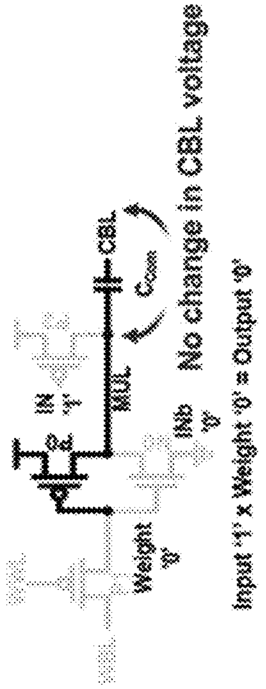

As illustrated in FIG. 7C, when the storage data is "0", the second switching element 120 is turned on and the third switching element 130 is turned off, and accordingly, the data operation node MUL is holded in a state of being pre-charged to a high level, thereby outputting an operation result "0".

Figure 7D:
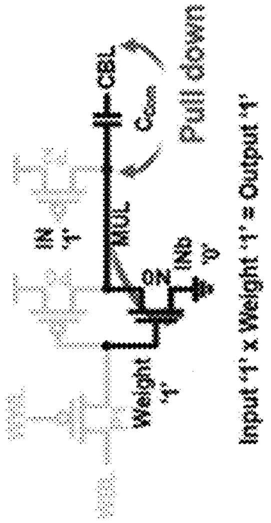

In addition, as illustrated in FIG. 7D, when the storage data is "1", the second switching element 120 is turned off and the third switching element 130 is turned on, and accordingly, the data operation node MUL is discharged, thereby, outputting low level data. That is, the operation result "1" is output. In this case, a voltage of the operation bit line CBL connected to the operation capacitor Ccom is also pulled down. In this way, it can be seen that the memory cell 100 performs a NAND operation on the storage data and the input data.

Figure 8:
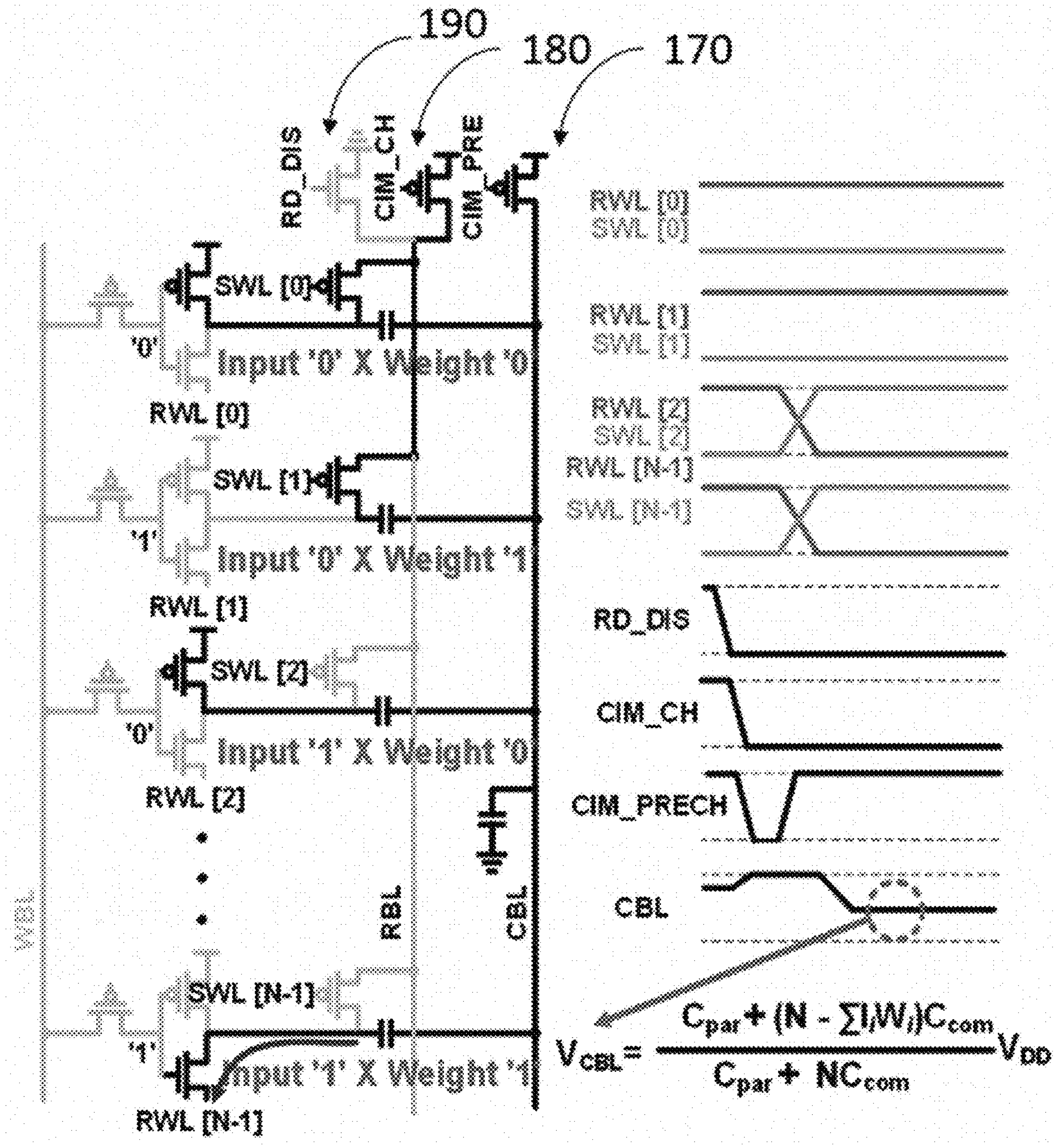

FIG. 8 illustrates an operation of each memory cell and an operation waveform in a state where a plurality of memory cells 100 are combined in an array form.

First, a control signal CIM_CH is applied to a switching element 180 connected to one terminal of the fourth switching element 140 of each of the plurality of memory cells 100, and a power supply voltage VDD is applied to the read bit line RBL. Then, a control signal CIM_PRE in a low level is temporarily applied to a switching element 170 connected to the operation bit line CBL, and accordingly, the operation bit line CBL is pre-charged to a high level voltage. Thereafter, voltages in opposite levels are respectively applied to the read word line RWL and the support word line SWL to cause input data to be applied to the operation node MUL for each cell. As the input data is applied to the operation node MUL, an operation result of the input data and the storage data stored in the data storage node STO is applied to the operation bit line CBL.

In this case, the plurality of memory cells 100 are commonly connected to the operation bit line CBL, and accordingly, operation results of the plurality of memory cell 100 are accumulated to determine a voltage level of the operation bit line CBL.

As described above, when the operation result is "0", the operation bit line CBL is holded in a state of being pre-charged to a high-level voltage. In addition, when the operation result is "1", the third switching element 130 is turned on to form a pull-down path, and a capacitive coupling effect through the operation capacitor Ccom is applied to pull down the operation bit line CBL. The degree of pull-down of a voltage level of the operation bit line CBL is determined by the number of memory cells 100 that output "1" as the operation result, and is also determined by a size of the operation capacitor Ccom or a parasitic capacitor Cpar of the operation bit line CBL connected to an array.

A voltage level of the operation bit line CBL may be determined by following Equation 1.

$$V_{CBL} = \frac{C_{par} + \left(N - \sum I_i W_i\right) C_{Com}}{C_{par} + N * C_{com}} * V_{DD} \quad \text{Equation 1}$$

That is, a value obtained by subtracting the number of operation capacitors Com corresponding to "1" of the product of storage data Wi and input data Ii from the total number of operation capacitors Ccom corresponding to the number (N) of memory cells 100 is output as a voltage of the operation bit line CBL, and is output as a value (MAC: multiply and accumulation) obtained by accumulating multiplication of the plurality of memory cells 100.

Next, a configuration of a memory cell 100' of a NOR type.

Figure 9:
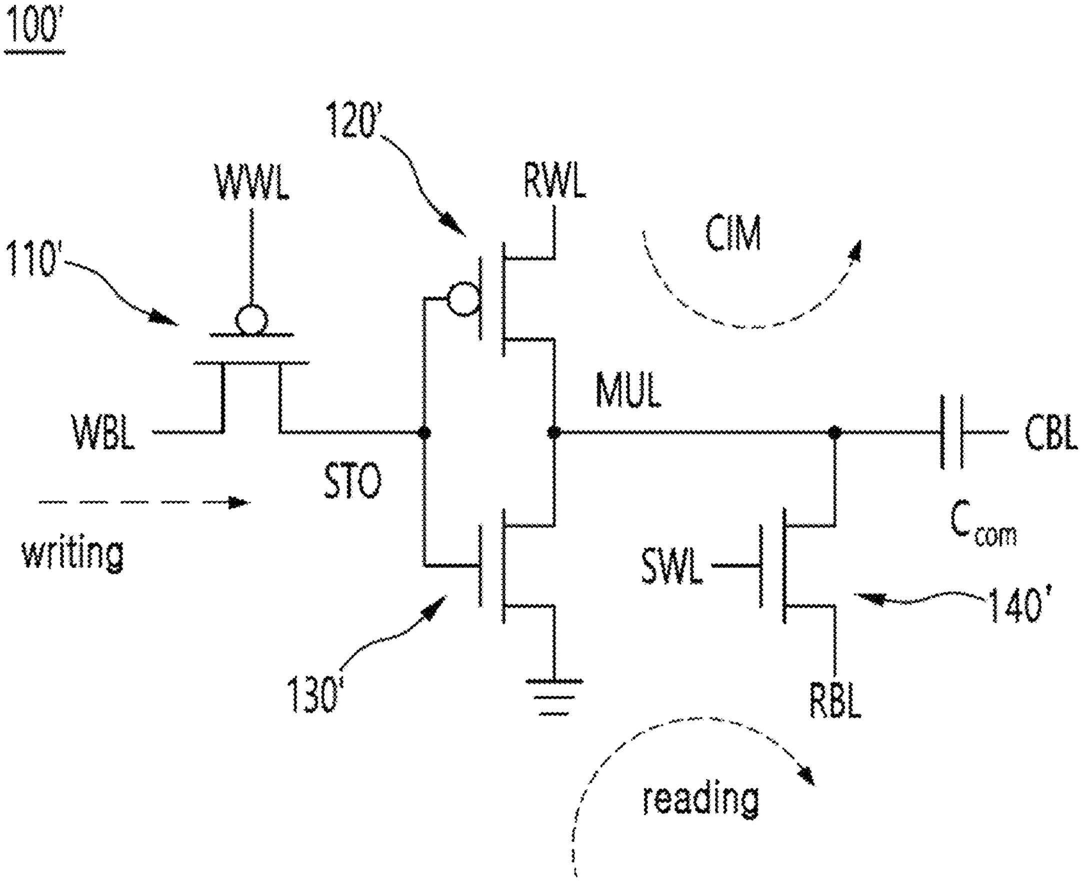
FIG. 9 is a diagram illustrating a configuration of a NOR type memory cell included in a memory device according to the present disclosure.

FIG. 9 is a diagram illustrating the configuration of the memory cell 100' of a NOR type included in the memory device of the present disclosure.

The memory cell 100' includes a first switching element 110' having a gate connected to the write word line WWL, one terminal connected to the write bit line WBL, and the other terminal used as the data storage node STO; a second switching element 120' and a third switching element 130' which are switched according to the data storage node STO, connected in series between the read word line RWL and a ground voltage, and a serially connected node used as the operation node MUL, a fourth switching element 140' having a gate connected to the support word line SWL, one terminal connected to the read bit line RBL, and the other terminal connected to an operation node MUL; and an operation capacitor Ccom connected between the operation node MUL and the operation bit line CBL. In this case, the second switching element 120' and the third switching element 130' are configured as switching elements having opposite polarities, and accordingly, only one of the second switching element 120' and the third switching element 130' is turned on according to a value of the data storage node STO. In addition, the first switching element 110' and the second switching element 120' may be PMOS transistors, and the third switching element 130' and the fourth switching element 140' may be NMOS transistors, but are not limited thereto, and may be modified into other types of switching elements.

Since a general operating principle of the memory cell 100' is similar to the operating principle of the memory cell 100 of a NAND type, and accordingly, differences therebetween are described below.

FIGS. 10, 11, 12, 13A, 13B, 13C, 13D, and 14 are diagrams illustrating operations of a memory cell of a NOR type according to an embodiment of the present disclosure.

Figure 10:
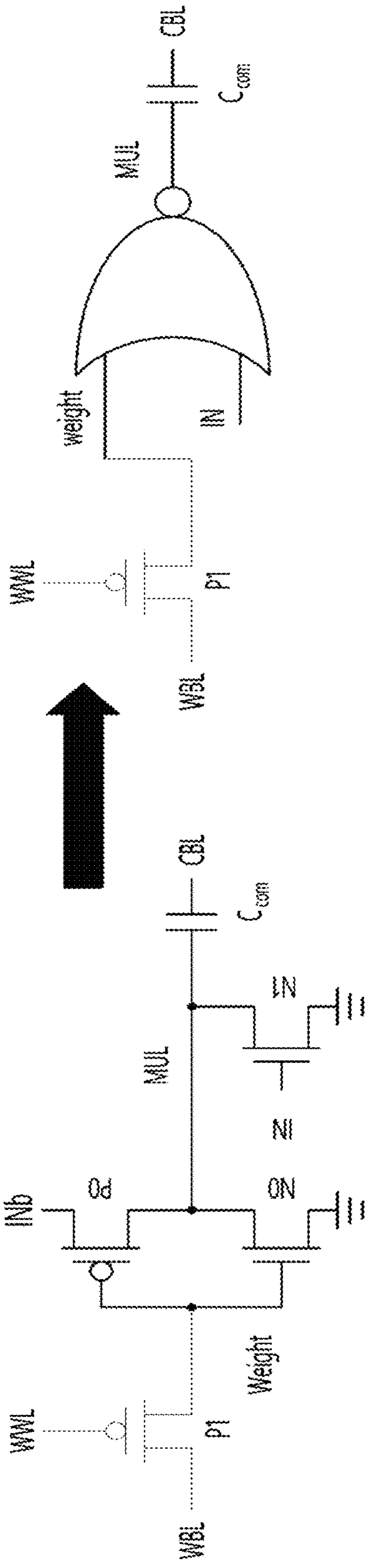

As illustrated in FIG. 10, the memory cell 100' operates like a digital logic gate that performs a NOR operation, and has a technical characteristic in that a voltage of a final output terminal is accumulated by using a capacitive coupling effect.

Referring to FIG. 11, a main operation of the memory cell 100' is described below.

First, during a write operation mode of the memory cell 100', in a state where the first switching element 110' is turned on according to a signal provided to the write word line WWL, and the fourth switching element 140' is turned off according to a signal provided to the support word line SWL, and write data (0 or 1) is transmitted to the data storage node STO through the write bit line WBL. Also, in order to write data of "0" to the data storage node STO without loss equivalent to a threshold voltage Vth, a voltage lower than a ground voltage VSS may be provided to the write word line WWL.

In addition, during a hold operation mode of the memory cell 100', in a state where the first switching element 110' is turned off according to the signal provided to the write word line WWL and the fourth switching element 140' is turned off according to the signal provided to the support word line SWL, a ground voltage VSS is applied to the read word line RWL and the read bit line RBL, and the ground voltage VSS is applied to the write bit line WBL, and accordingly, a state of the data storage node STO is holded.

In addition, a read operation mode of the memory cell 100' is described below. Before performing the read operation, the read bit line RBL is pre-charged, and then, when the fourth switching element 140' is turned on according to a signal provided to the support word line SWL and the power supply voltage VDD is applied to the read word line RWL, the data stored in the data storage node STO is stored is output to the read bit line RBL through the fourth switching element 140'. When "0" is stored in the data storage node STO, the second switching element 120' is turned on, and accordingly, the power supply voltage VDD is output to the read bit line RBL, and when "1" is stored in the data storage node STO, the third switching element 130' is turned on, and accordingly, the ground voltage VSS is output to the read bit line RBL. Accordingly, the data stored in the data storage node STO may be clearly distinguished as "0" and "1".

Next, an operation of the memory cell 100' is described below.

Figure 12:
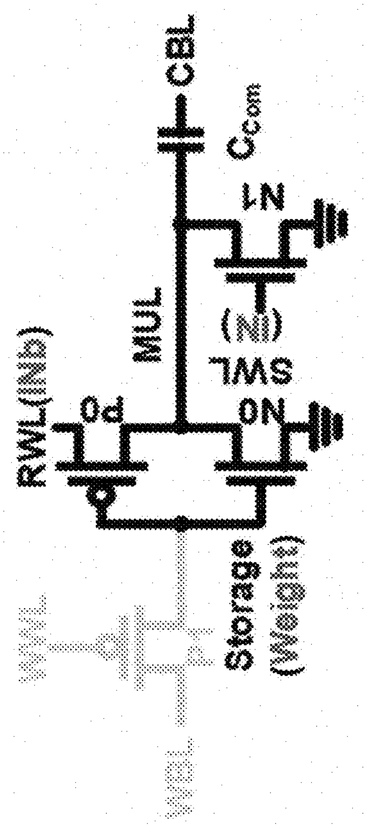

As illustrated in FIG. 12, a value stored in the data storage node STO is used as weight data, a value input through the support word line SWL is used as input data, and a NOR operation result of the weight data and the input data is output to the operation node MUL. Also, in order to deactivate a memory write operation, the power supply voltage VDD is applied to the write word line WWL to turn off the first switching element 110', and the ground voltage VSS is applied to the write bit line WBL.

Figure 13A:
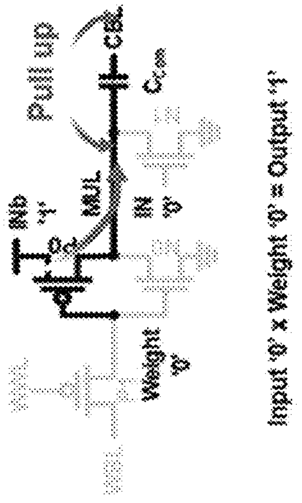

During the operation of the memory cell 100', in a state where the ground voltage VSS is applied to the read bit line RBL, and in a state where the data operation node MUL and the operation bit line CBL are pre-discharged, when the input data is "1", the fourth switching element 140' is turned on to pull down the operation node MUL, and accordingly, the data operation node MUL is holded in a pre-discharged state at a low level regardless of the storage data, and the operation bit line CBL also holds a discharged state. That is, an operation result "0" that does not cause any operation is output. This operation is illustrated in FIGS. 13C and 13D.

In addition, when the input data is "0", the fourth switching element 140 is turned off, and an output of the operation bit line CBL changes according to the storage data.

Figure 13B:
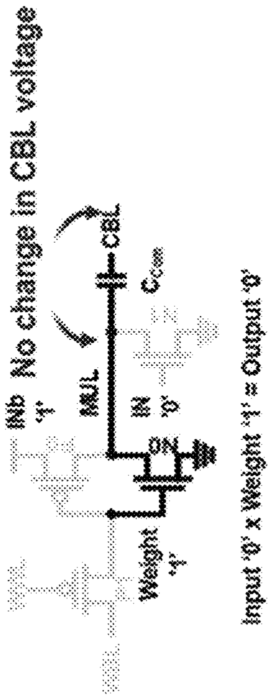
Figure 13C:
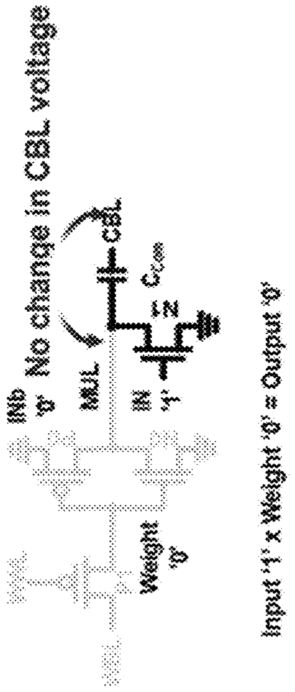
Figure 13D:
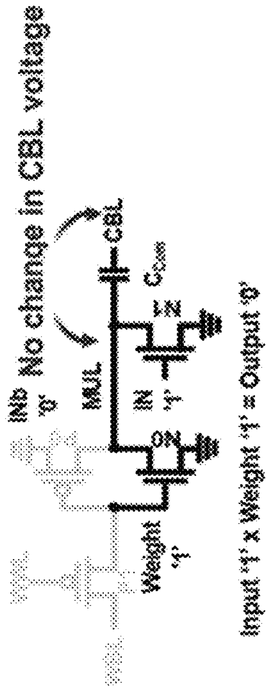

As illustrated in FIG. 13B, when the storage data is "1", the third switching element 130' is turned on, and the second switching element 120' is turned off, the data operation node MUL is holded in a state of being pre-discharged to a low level, thereby outputting an operation result "0".

In addition, as illustrated in FIG. 13A, when the storage data is "0", the second switching element 120' is turned on, and the third switching element 130' is turned off, and accordingly, the data operation node MUL is pulled up to output high-level data. That is, the operation result "1" is output. In this case, the operation bit line CBL connected to the operation capacitor Ccom is also pulled up. In this way, it can be seen that the memory cell 100' performs a NOR operation on the storage data and the input data.

Figure 14:
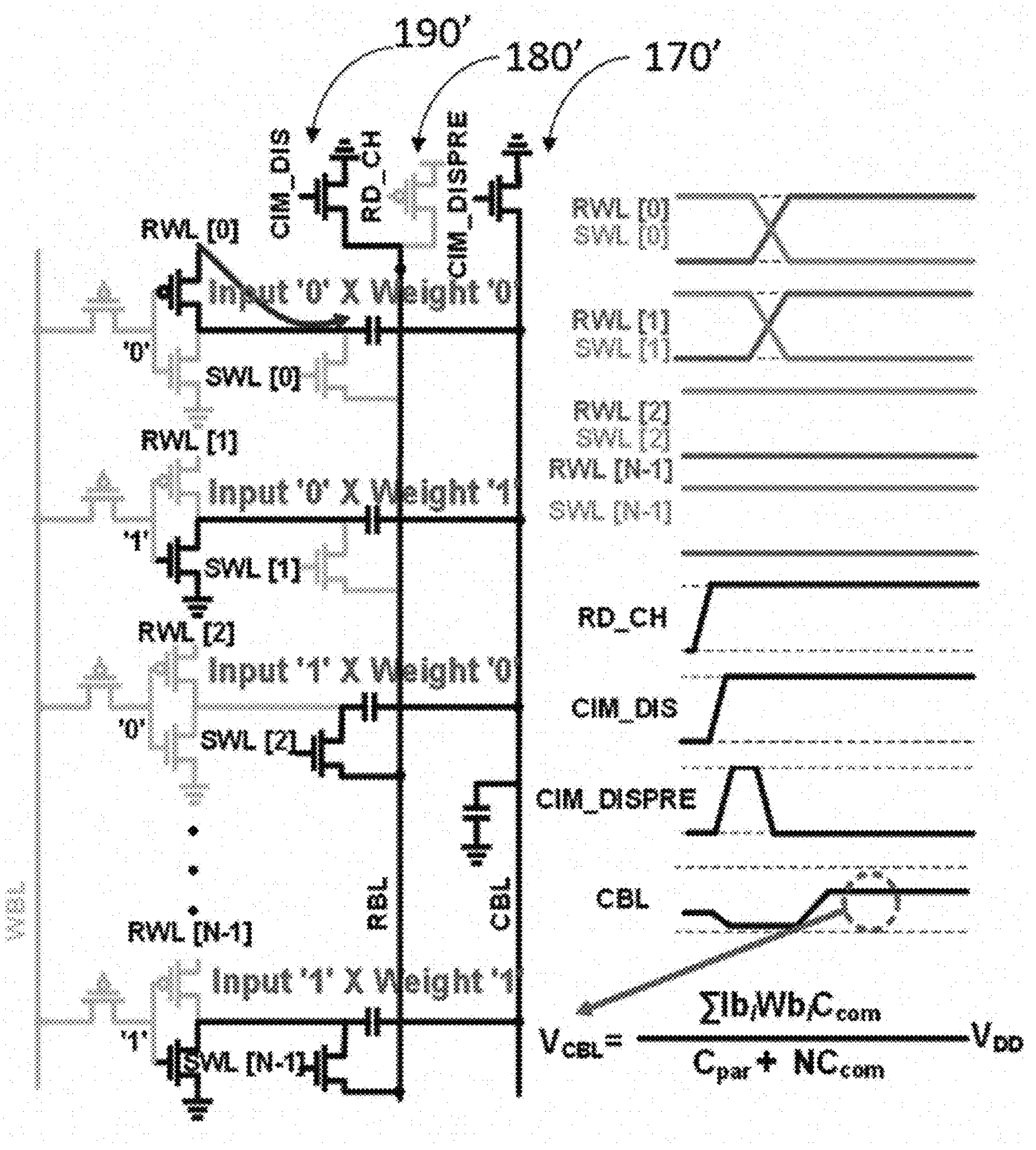

FIG. 14 illustrates an operation of each memory cell and an operation waveform in a state where a plurality of memory cells 100' are combined in an array form.

First, a control signal CIM_DIS is applied to a switching element 190' connected to one terminal of the fourth switching element 140' of each memory cell to ground the read bit line RBL, and a high-level control signal CIM_DISPRE is temporarily applied to a switching element 170' connected to one terminal of the operation bit line CBL to pre-discharge the operation bit line CBL to a low level. Thereafter, voltages in opposite levels are respectively applied to the read word line RWL and the support word line SWL to cause input data to be applied to the operation node MUL for each cell. As the input data is applied to the operation node MUL, an operation result of the input data and the storage data stored in the data storage node STO is applied to the operation bit line CBL. In this case, the plurality of memory cells 100' are commonly connected to the operation bit line CBL, and accordingly, operation results of the plurality of memory cell 100' are accumulated to determine a voltage level of the operation bit line CBL.

As described above, when the operation result is "0", the operation bit line CBL is holded in a state of being pre-discharged to a low-level voltage. In addition, when the operation result is "1", the second switching element 120' is turned on to form a pull-up path, and a capacitive coupling effect through the operation capacitor Ccom is applied to pull up the operation bit line CBL. The degree of pull-up of a voltage level of the operation bit line CBL is determined by the number of memory cells 100' that output "1" as the operation result, and is also determined by a size of the operation capacitor Ccom or a parasitic capacitor Cpar of the operation bit line CBL connected to an array.

The voltage level of the operation bit line CBL may be determined by following Equation 2.

$$V_{CBL} = \frac{\sum Ib_i Wb_i \; C_{Com}}{C_{par} + N * C_{com}} * V_{DD} \quad \text{Equation 2}$$

That is, the sum of the number of operation capacitors Ccom corresponding to "1" of the product of inverted storage data Wbi and inverted input data Ibi is output as a voltage of the operation bit line CBL, and is output as a value (MAC) obtained by accumulating multiplication of the plurality of memory cells 100'.

Figure 15:
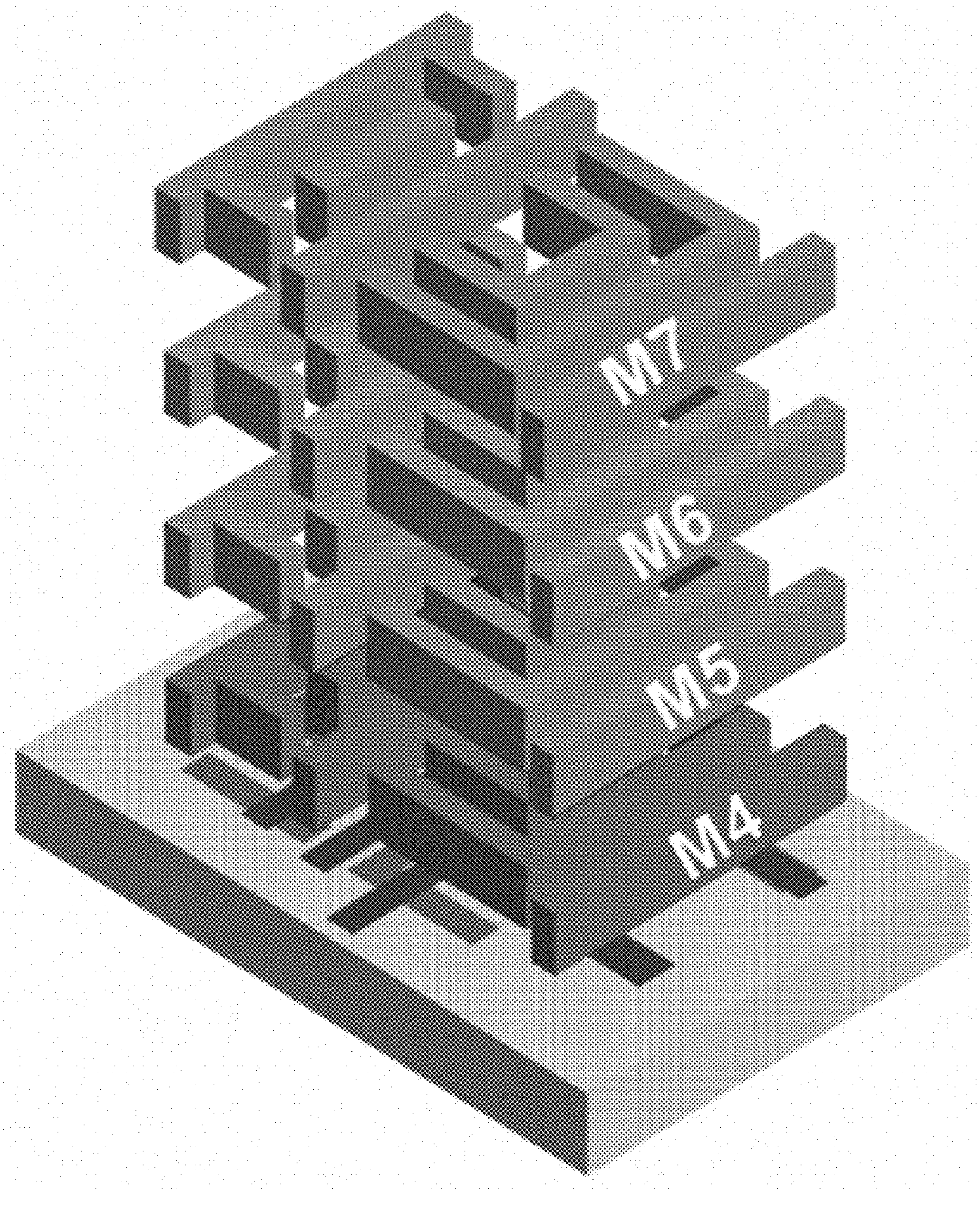
FIG. 15 illustrates an example configuration of a capacitor according to an embodiment of the present disclosure.

FIG. 15 illustrates an example configuration of the operation capacitor Ccom according to an embodiment of the present disclosure.

The present disclosure may use a MOMCAP formed by stacking a plurality of metal wires on a memory cell implemented by a transistor to form a capacitor without affecting a size of the memory cell.

The above description of the present disclosure is intended to be illustrative, and those skilled in the art will appreciate that the present disclosure may be readily modified in other specific forms without changing the technical idea or essential characteristic of the present disclosure. Therefore, the embodiments described above should be understood as illustrative in all respects and not limiting. For example, each component described in a single type may be implemented in a distributed manner, and likewise, components described in a distributed manner may be implemented in a combined form.

The scope of the present application is indicated by the claims described below rather than the detailed description above, and all changes or modified forms derived from the meaning, scope of the claims, and their equivalent concepts should be interpreted as being included in the scope of the present application.

What is claimed is:

1. A memory device comprising:

a plurality of memory cells configured to perform in-memory computing, wherein each of the plurality of memory cells includes:

a first switching element that is switched in response to a signal applied to a write word line and has one terminal connected to a write bit line and another terminal used as a data storage node;

a second switching element and a third switching element that are switched according to a voltage of the data storage node, are serially connected between a power supply voltage and a read word line, and commonly have a serially connected node used as an operation node;

a fourth switching element that is switched in response to a signal applied to a support word line and has one terminal connected to a read bit line and another terminal connected to the operation node; and an operation capacitor connected between the operation node and an operation bit line, and the second switching element and the third switching element have opposite polarities.

2. The memory device of claim 1, wherein the memory cell outputs a NAND operation result of storage data stored in the data storage node and input data applied to the support word line to the operation node.

3. The memory device of claim 1, wherein the first switching element, the second switching element, and the fourth switching element are PMOS transistors, and the third switching element is an NMOS transistor.

4. The memory device of claim 1, wherein during a write operation mode of each of the plurality of memory cells, in a state where the first switching element is turned on according to a signal provided to the write word line and the fourth switching element is turned off according to a signal provided through the support word line, input data is transmitted to the data storage node through the write bit line.

5. The memory device of claim 1, wherein during a hold operation mode of each of the plurality of memory cells, in a state where the first switching element is turned off according to a signal provided to the write word line and the fourth switching element is turned off according to a signal provided to the support word line, the power supply voltage is applied to the read word line and the read bit line, and a ground voltage is applied to the write bit line to hold a state of the data storage node.

6. The memory device of claim 1, wherein during a read operation mode of each of the plurality of memory cells, the read bit line is pre-discharged, and the power supply voltage is applied to the read word line, the support word line, and the operation bit line, the read word line is grounded, and the fourth switching element is turned on according to a signal provided to the support word line to output data stored in the data storage node to the read bit line through the fourth switching element, when data of "0" is stored in the data storage node, the second switching element is turned on to output the power supply voltage to the read bit line, and when data of "1" is stored in the data storage node, the third switching element is turned on to output a ground voltage to the read bit line.

7. The memory device of claim 1, wherein during an operation of the memory cell, in a state where the operation node and the operation bit line are pre-charged, when the input data is "0", the fourth switching element is turned on to pull up the operation node, and the operation node holds a pre-charged state to output an operation result of "0", when the input data is "1", the fourth switching element is turned off, and when the storage data is "0", the second switching element is turned on, and the operation node holds a pre-charged state to output the operation result of "0", and when the storage data is "1" data, the third switching element is turned on, and the operation node is discharged to output an operation result of "1".

8. A memory device comprising:

a plurality of memory cells configured to perform in-memory computing, wherein each of the plurality of memory cells includes:

a first switching element that is switched in response to a signal applied to a write word line and has one terminal connected to a write bit line and another terminal used as a data storage node;

a second switching element and a third switching element that are switched according to a voltage of the data storage node, are serially connected between a read word line and a ground voltage, and commonly have a serially connected node used as an operation node;

a fourth switching element that is switched in response to a signal applied to a support word line and has one terminal connected to a read bit line and another terminal connected to the operation node; and an operation capacitor connected between the operation node and an operation bit line, and the second switching element and the third switching element have opposite polarities.

9. The memory device of claim 8, wherein the memory cell outputs a NOR operation result of storage data stored in the data storage node and input data applied to the support word line to the operation node.

10. The memory device of claim 8, wherein the first switching element and the second switching element are PMOS transistors, and the third switching element and the fourth switching element are NMOS transistors.

11. The memory device of claim 8, wherein during a write operation mode of each of the plurality of memory cells, in a state where the first switching element is turned on according to a signal provided to the write word line and the fourth switching element is turned off according to a signal provided through the support word line, input data is transmitted to the data storage node through the write bit line.

12. The memory device of claim 8, wherein during a hold operation mode of each of the plurality of memory cells, in a state where the first switching element is turned off according to a signal provided to the write word line and the fourth switching element is turned off according to a signal provided to the support word line, the ground voltage is applied to the read word line and the read bit line, and the ground voltage is applied to the write bit line to hold a state of the data storage node.

13. The memory device of claim 8, wherein during a read operation mode of each of the plurality of memory cells, the read bit line is pre-charged, and the ground voltage is applied to the read word line, the support word line, and the operation bit line, a power supply voltage is applied to the read word line, and the fourth switching element is turned on according to a signal provided to the support word line to output data stored in the data storage node to the read bit line through the fourth switching element, when data of "0" is stored in the data storage node, the second switching element is turned on to output the power supply voltage to the read bit line, and when data of "1" is stored in the data storage node, the third switching element is turned on to output the ground voltage to the read bit line.

14. The memory device of claim 8, wherein during an operation of the memory cell, in a state where the operation node and the operation bit line are pre-discharged, when the input data is "1", the fourth switching element is turned on to pull down the operation node, and the operation node holds a pre-discharged state to output an operation result of "0", when the input data is "0", the fourth switching element is turned off, and when the storage data is "0", the second switching element is turned on, and the operation node is pulled up to output the operation result of "1", and when the storage data is "1" data, the third switching element is turned on, and the operation node holds a pre-discharged state to output an operation result of "0".

* * * * *